United States Patent
Degener et al.

(10) Patent No.: US 8,963,616 B2
(45) Date of Patent: Feb. 24, 2015

(54) CIRCUIT TOPOLOGY FOR A PHASE CONNECTION OF AN INVERTER

(71) Applicant: Kostal Industrie Elektrik GmbH, Luedenscheid (DE)

(72) Inventors: Martin Degener, Bochum (DE); Michael Kretschmann, Hagen (DE)

(73) Assignee: Kostal Industrie Elektrik GmbH, Luedenscheid (DE)

( * ) Notice: Subject to any disclaimer, the term of this patent is extended or adjusted under 35 U.S.C. 154(b) by 96 days.

(21) Appl. No.: 13/686,089

(22) Filed: Nov. 27, 2012

(65) Prior Publication Data

US 2013/0154716 A1  Jun. 20, 2013

Related U.S. Application Data

(63) Continuation of application No. PCT/EP2011/059627, filed on Jun. 9, 2011.

(30) Foreign Application Priority Data

Jun. 12, 2010 (DE) .......................... 10 2010 023 601

(51) Int. Cl.
*H03K 17/56* (2006.01)
*H03K 17/60* (2006.01)
*H03K 17/687* (2006.01)
(Continued)

(52) U.S. Cl.
CPC .............. *H03K 3/012* (2013.01); *H02M 7/487* (2013.01); *H02M 7/5388* (2013.01)
USPC ........... 327/424; 327/432; 327/433; 327/434; 327/436; 363/132

(58) Field of Classification Search
USPC ................... 327/424, 432–434, 436; 363/132
See application file for complete search history.

(56) References Cited

U.S. PATENT DOCUMENTS 6,268,990 B1 * 7/2001 Ogura et al. ................ 361/91.7
7,741,883 B2 * 6/2010 Fuller et al. ................... 327/108
(Continued)

FOREIGN PATENT DOCUMENTS

JP  2002247862 A  8/2002

OTHER PUBLICATIONS

European Patent Offce, International Search Report for corresponding PCT/EP2011/059627 mailed May 30, 2012.
Michael Frisch, Temesi Emo: "Innovative Topologies for High Efficient Solar Applications," Power Electronics Europe, Mar. 30, 2009.
(Continued)

*Primary Examiner* — Lincoln Donovan
*Assistant Examiner* — Colleen O Toole
(74) *Attorney, Agent, or Firm* — Brooks Kushman P.C.

(57) ABSTRACT

A circuit for a phase connection of an inverter includes upper and lower bridge halves and respectively associated upper and lower bridge segments. Each bridge half has an outer switch and an inner switch connected in series. Each bridge segment has a diode and the inner switch of the associated bridge half connected in series. An output of the circuit is respectively connected to upper and lower potentials through the outer switches and is further connected to a center potential applied between the upper and lower potentials through each of the upper and lower bridge segments. Each bridge half further has a parallel power switch. The parallel switch of each bridge half is connected in parallel to the series-connected outer and inner switches of the bridge half. The output of the circuit is further respectively connected to the upper and lower potentials through the parallel switches.

8 Claims, 4 Drawing Sheets

(51) Int. Cl.
*H02M 7/5387* (2007.01)
*H03K 3/012* (2006.01)
*H02M 7/487* (2007.01)
*H02M 7/5388* (2007.01)

(56) References Cited

U.S. PATENT DOCUMENTS

| | | | |
|---|---|---|---|
| 8,144,490 B2* | 3/2012 | El-Barbari et al. | 363/43 |
| 8,649,197 B2* | 2/2014 | Abe | 363/98 |
| 2010/0039843 A1 | 2/2010 | Takizawa | |

OTHER PUBLICATIONS

The International Bureau of WIPO, International Preliminary Report on Patentability for the corresponding International Application No. PCT/EP2011/059627 mailed Jan. 4, 2013.

Michael Frisch, Temesi Ernö: "Innovative Topologies for High Efficient Solar Applications," 'Power Electronics Europe, Mar. 30, 2009.

Bartlomiej Kaminski, Wlodzimierz Koczara, Nazar Al-Khayat, "A three-level inverter concept for low voltage applications," Database Compendex [Online] Engineering Information, Inc., New York, NY, US; European Conference on Power Electronics and Applications, Institute of Electronics and Electronics Engineering Computer Society US, 2007.

* cited by examiner

CIRCUIT TOPOLOGY FOR A PHASE CONNECTION OF AN INVERTER

CROSS-REFERENCE TO RELATED APPLICATIONS

This application is a continuation of International Application No. PCT/EP2011/059627, published in German, with an International filing date of Jun. 9, 2011, which claims priority to DE 10 2010 023 601.2, filed Jun. 12, 2010; the disclosures of which are incorporated in their entirety by reference herein.

TECHNICAL FIELD

The present invention relates to a circuit topology for a phase connection of an inverter, the circuit topology including a circuit bridge having upper and lower bridge halves and upper and lower bridge segments respectively associated with the upper and lower bridge halves, each bridge half having an outer switch and an inner switch connected in series, each bridge segment having a diode and the inner switch of the associated bridge half connected in series, and an output of the circuit bridge is respectively connected to upper and lower potentials through the outer switches of the upper and lower bridge halves and is connected to a center potential applied between the upper and lower potentials through each of the upper and lower bridge segments.

The present invention further relates to a method for producing a phased output voltage of an inverter having such a circuit topology.

BACKGROUND

Inverters are used to convert an electrical DC voltage into a single- or multi-phase AC voltage. Inverters are applied in the photovoltaic area to be used when a DC voltage produced by solar cells is to be converted into an AC voltage for use on the public power grid.

Another application for inverters is in the operation of electric motors, particularly asynchronous motors. An inverter is used as the component of a frequency converter, which converts an AC network voltage to a higher frequency and amplitude. Most modern frequency converters are designed as converters having a constant intermediate circuit voltage. The grid-side input voltage is converted with the aid of a rectifier into a DC voltage, which is smoothed by condensers.

A plurality of circuit topologies in existence can be used to produce an AC voltage from a DC voltage. It is immaterial whether the circuit topology is dealing with an original DC voltage from, for example, a solar module or with the rectified intermediate circuit voltage of a frequency converter.

Common features to these circuit topologies is the principle that the output of the inverter is connected to different potentials by the pulsed opening and closing of electronic power switches, thereby producing a desired AC voltage.

An important quantity used to characterize the quality of inverters is their efficiency. The efficiency is the ratio of the power produced, or usable power, with respect to the supplied power, which should be as large as possible.

A significant factor limiting the attainable efficiency is represented by losses that occur in the components used, especially in the electronic power switches. Although affected by many factors, two relevant loss mechanisms play a role in the losses occurring from the power switches.

The first loss mechanism involves switching losses. A switching loss occurs at each instant of opening and closing a switch. Switching losses generally increase proportionally with the switching frequency of a switch. At a given switching frequency, a switch having a high voltage resistance, and thus being suitable for switching high voltages, produces considerably greater switching losses than a switch having a low voltage resistance.

The second loss mechanism involves conduction losses. A conduction loss arises in the conducting state of a switch. Conduction losses are proportional to the voltage drop over the switch in the conducting state, which is known as the saturation voltage. The saturation voltage decreases only slightly with the voltage resistance of the switch, and depends on other factors in addition to the voltage resistance of the switch, so that the conduction losses can be considered to depend only on the voltage resistance of the switch.

These two loss mechanisms have a different weighting in different circuit topologies. As a result, manufacturers offer semiconductor switches that are suitable to these purposes such as components like MOSFETs and IGBTs which exhibit different properties. On the one hand, some switches are optimized to achieve low switching losses with the tradeoff of a somewhat higher saturation voltage. On the other hand, other switches are optimized to obtain a lower saturation voltage with the tradeoff of somewhat higher switching losses.

FIG. 2 illustrates a conventional two-level half bridge. The two-level half bridge shown in FIG. 2 is a standard circuit topology having two power switches S1, S4 per phase. Here, as in the other examples herein, only one phase is depicted. The two-level half bridge includes a bridge output BA. Bridge output BA is alternatively connected to an upper DC voltage U_ZK+ via switch S1 and to a lower DC voltage U_ZK− via switch S4. For switching over the entire voltage swing, switches having a high voltage resistance (i.e., low conduction losses) are considered for being switches S1, S4. Relatively large switching losses occur at particular frequencies for such switches. In general, the switching losses are dominant in typical inverter and rectifier applications in which switches such as switches S1, S4 of the two-level half bridge are employed.

Another conventional circuit topology for a phase connection of an inverter is the multilevel topology. FIGS. 3a and 3b illustrate the "neutral-point point-clamped" three-level topology, which represents a relatively simple and useful embodiment of a multilevel topology. This three-level topology includes four power switches S1, S2, S3, S4 and two diodes D1, D2 per phase.

In this three-level topology, the voltage swings during the switching of an individual switch always correspond to only half the entire voltage swing U_ZK+-U_ZK−. Consequently, power switches that require only half the voltage resistance (i.e., low switching losses) for the same overall voltage swing as compared to the two-level half bridge topology described with respect to FIG. 2 can be used. Such switches with relatively low voltage resistances generally produce distinctly smaller switching losses than switches with higher voltage resistances at the same switching frequency. The total switching losses for this three-level circuit topology are also smaller than that of the two-level half bridge topology.

On the other hand, however, in this three-level circuit topology current flows through two semiconductor devices at any given time in the conducting state of a power switch(es). In particular, the current flows through either two power switches such as switches S1 and S2 as shown in FIG. 3a or one diode and one power switch such as diode D1 and switch S2. The conduction losses for a three-level topology are thus greater than for a two-level topology. In general, for typical inverter and rectifier applications, the conduction losses are dominant in the three-level topology.

For the same power loss, the multilevel (e.g., three-level) topologies enable operation at higher switching frequencies than the two-level topology. This enables smaller and cheaper passive components to be used. Such components require less space and help reduce ripple in the output voltage. Based on such factors, multilevel topologies continue to be used more often in spite of the limitation in the efficiency due to conduction losses as described above.

SUMMARY

An object of the present invention includes a multilevel (e.g., three-level) circuit topology for a phase connection of an inverter in which efficiency losses including conduction losses are reduced as compared to conventional multilevel circuit topologies.

Another object of the present invention includes a method for generating a phase output voltage of an inverter having the multilevel circuit topology.

In carrying out at least one of the above and other objects, the present invention provides a circuit topology for a phase connection of an inverter. The circuit topology includes a circuit bridge having upper and lower bridge halves and upper and lower bridge segments respectively associated with the upper and lower bridge halves. Each bridge half has an outer switch and an inner switch connected in series. Each bridge segment has a diode and the inner switch of the associated bridge half connected in series. The circuit bridge has an output respectively connected to upper and lower potentials through the outer switches of the upper and lower bridge halves. The output of the circuit bridge is further respectively connected to a center potential applied between the upper and lower potentials through each of the upper and lower bridge segments. Each of the upper and lower bridge halves further has a parallel power switch, wherein the parallel switch of each bridge half is connected in parallel to the series-connected outer and inner switches of the bridge half. The output of the circuit bridge is further respectively connected to the upper and lower potentials through the parallel switches of the upper and lower bridge halves.

Further, in carrying out at least one of the above and other objects, the present invention provides a method for producing a phased output voltage of an inverter by the circuit bridge of the circuit topology.

In general, embodiments of the present invention are directed to a circuit topology for a phase connection of an inverter. The circuit topology includes a circuit bridge. The circuit bridge has upper and lower bridge halves and upper and lower bridge segments. The upper and lower bridge segments are respectively associated with the upper and lower bridge halves. Each bridge half has an outer power switch and an inner power switch. The outer and inner switches of each bridge half are connected in series. Each bridge segment has a diode and the inner switch of the associated bridge half. The diode and the inner switch of the associated bridge half in each bridge segment are connected in series. An output of the circuit bridge is respectively connected to upper and lower boundary potentials through the outer switches of the upper and lower bridge halves. The output of the circuit bridge is further respectively connected to a center potential applied between the upper and lower potentials through each of the upper and lower bridge segments. Each of the upper and lower bridge halves further has a parallel power switch. The parallel switch of each bridge half is connected in parallel to the series-connected outer and inner switches of that bridge half. The output of the circuit bridge is further respectively connected to the upper and lower potentials through the parallel switches of the upper and lower bridge halves.

A circuit topology in accordance with embodiments of the present invention can be used for the three-level topology as described herein and for multilevel topologies of higher order.

A circuit topology in accordance with embodiments of the present invention has a relatively higher efficiency than conventional multilevel circuit topologies. The higher efficiency is achieved as a result of the upper and lower bridge halves each having a parallel switch connected in parallel to the series-connected outer and inner switches of the respective bridge half For higher order multilevel topologies in accordance with embodiments of the present invention, the circuit bridge includes additional power switches, connected in series between the outer and inner switches, and diodes through which the bridge output can be connected to intermediate potentials lying between the center potential and the upper and lower potentials.

In an embodiment, the series-connected outer and inner switches of each of the upper and lower bridge halves are designed to produce relatively small switching losses. The tradeoff to produce such relatively small switching losses is that these switches have a relatively large saturation voltage. As a result, a more extensive reduction in circuit losses and with it an increase in the inverter efficiency is achieved.

In an embodiment, the parallel switch of each the upper and lower bridge halves is designed to achieve a relatively small saturation voltage (i.e., produce relatively small conduction losses). The tradeoff to produce such relatively small conduction losses is that these switches produce relatively large switching losses. Again, as a result, a more extensive reduction in circuit losses and with it an increase in the inverter efficiency is achieved.

In an embodiment, the series-connected outer and inner switches of each of the upper and lower bridge halves are designed to produce relatively small switching losses whereas the parallel switch of each the upper and lower bridge halves is designed to produce relatively small conduction losses. In this case, an even more extensive reduction in circuit losses and with it an even greater increase in the inverter efficiency is achieved.

The above features, and other features and advantages of the present invention are readily apparent from the following detailed description thereof when taken in connection with the accompanying drawings. It is understood that the features stated above and to be explained below may be used not only in the particular stated combination, but also in other combinations or alone without departing from the scope of the present invention.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 4:
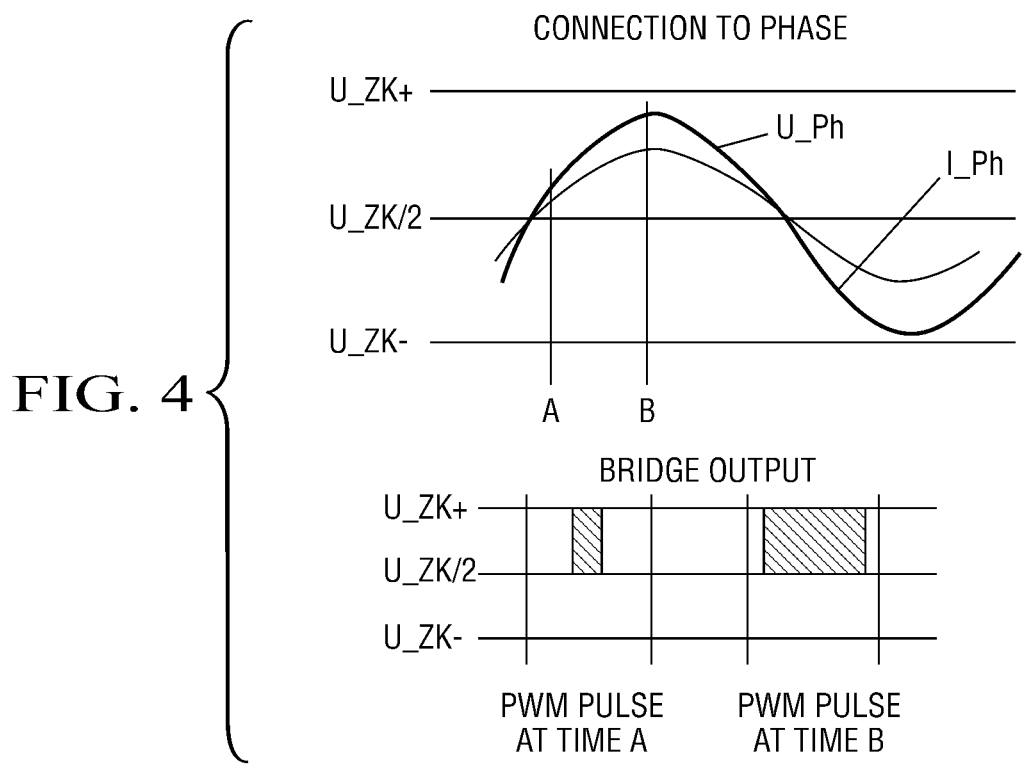
FIG. 4 illustrates the relationship between the phase voltage, the voltage at the bridge output, and the PWM on-off ratio for the conventional three-level circuit topology according to FIGS. 3a and 3b.
Figure 3A:
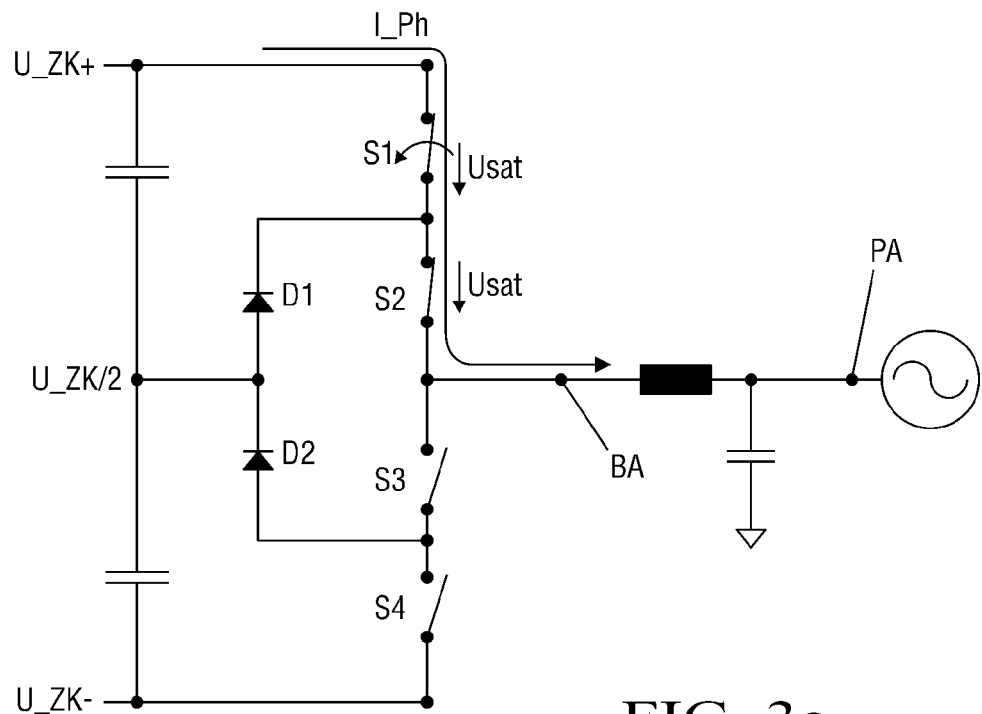
FIGS. 3a and 3b each illustrates a circuit diagram of a conventional three-level circuit topology with FIG. 3a depicting a switching time interval during closing of the outer switch of the upper bridge half and FIG. 3b depicting a switching time interval during opening of the outer switch of the upper half bridge half.
Figure 3B:
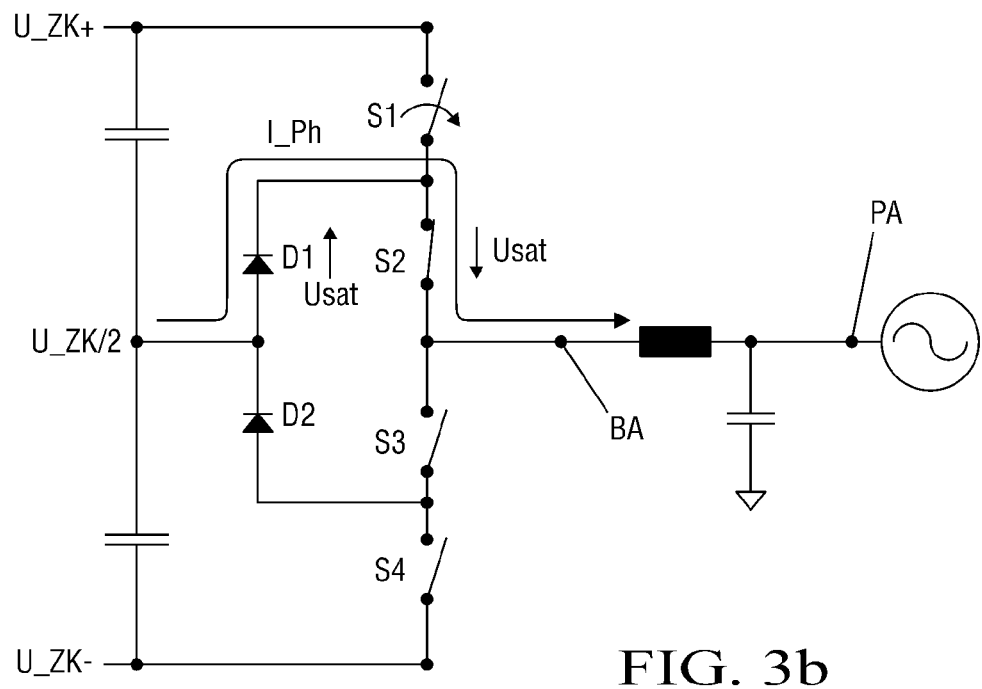

Referring initially to FIGS. 3a and 3b and to FIG. 4, the operation of a conventional three-level circuit topology will again be discussed for the purpose of understanding the operation and advantages of circuit topologies in accordance with embodiments of the present invention. The conventional three-level topology shown in FIGS. 3a and 3b is the conventional neutral point clamped three-level circuit bridge.

This circuit bridge has upper and lower bridge halves and upper and lower bridge segments. The upper and lower bridge segments are respectively associated with the upper and lower bridge halves. Each bridge half has an outer power switch (S1; S4) and an inner power switch (S2; S3). Outer and inner switches (S1, S2; S3, S4) of each bridge half are connected in series. Each bridge segment has a diode (D1; D2) and an inner switch (S2; S3) of the associated bridge half. Diode (D1; D2) and inner switch (S2; S3) of the associated bridge half in each bridge segment are connected in series. An output BA of this circuit bridge is respectively connected to upper and lower boundary potentials (U_ZK+; U_ZK−) through outer switches (S1; S4) of the upper and lower bridge halves. Bridge output BA is further respectively connected to a center potential (U_ZK/2) applied between the upper and lower potentials (U_ZK+; U_ZK−) through each of the upper and lower bridge segments. A phase connection PA is connected to bridge output BA. Phase connection PA is connected to bridge output BA through a filter that is formed by an inductor and a capacitor.

Without limiting this explanation to the application in which it represents a frequency converter, the input DC voltage of this bridge circuit is designated as the intermediate circuit voltage, which is conventional in such an application, for the purpose of better differentiability in the following. For the following explanation it suffices to consider a single switching pulse, i.e., the opening and closing of outer power switch S1 of the upper bridge half.

The potential of the sinusoidal phases (i.e., grid voltage U_Ph) is applied to phase connection PA via bridge output BA. In this example, grid voltage U_Ph is always to be above the center potential or, in other words, above the intermediate circuit voltage U_ZK/2. Thus, only outer switches S1 and S4 switch on-and-off in the three-level circuit bridge. Typically, a pulse width modulated (PWM) signal is produced at bridge output BA. The pulse width ratio, namely the ratio between the "on-time" in which upper circuit voltage U_ZK+ is applied at bridge output BA (i.e., the time in which outer switch S1 is closed) and the "off-time" in which intermediate circuit voltage U_ZK/2 is applied at bridge output BA (i.e., the time in which outer switch S1 is opened), is thus approximately proportional to the instantaneous phase voltage U_Ph.

As an example, FIG. 4 illustrates how the PWM-ratio changes with phase voltage U_Ph on the half sine wave. At time point A, at which phase voltage U_Ph lies only slightly above intermediate circuit voltage U_ZK/2, the "on-time" is distinctly shorter than the "off-time". At time point B, at which phase voltage U_Ph reaches its maximum value, this ratio is reversed. For use in inverters and similar applications, a phase current I_Ph is moreover ideally in phase with phase voltage U_Ph.

Inner switch S2 of the upper bridge half remains closed while outer switch S1 of the upper bridge half is closing and opening. Thus, inner switch S2 is conducting for the entire time interval in which phase voltage U_Ph is greater than intermediate circuit voltage U_ZK/2. In FIG. 3a, which shows the onset of the "on-time" of the PWM-period, outer switch S1 closes and the output voltage on bridge output BA corresponds to U_ZK+. The switching-on loss PSchalt_ein is obtained by closing outer switch S1. In this closed state, phase current I_Ph flows through both outer and inner switches S1 and S2. The saturation voltage Usat therefore drops on switches S1 and S2 respectively, for which a typical value of 1.5 volts is assumed for the purpose of a sample calculation, and the same for diode D1.

In FIG. 3b, which shows the time interval following the sequence of the "on-time" of the PWM-period, outer switch S1 opens. This results in the switching-off loss PSchalt_aus. Phase current I_Ph subsequently flows through diode D1 and inner switch S2, wherein the saturation voltage Usat is applied respectively to both components. The sum of the losses is obtained from the switching losses PSchalt_ein and PSchalt_aus and the saturation voltage Usat multiplied by phase current I_Ph. If an effective phase current of I_Ph=100 amperes is assumed for the present calculated example, then to an approximation based on the assumed saturation voltage of Usat_=1.5 volts a forward power dissipation is obtained as P_DV=100 A*1.5 V*2=300 watts.

Referring now to FIGS. 1a, 1b, 1c, and 1d, a three-level circuit topology in accordance with an embodiment of the present invention will be described. This circuit topology in accordance with an embodiment of the present invention includes a circuit bridge having the same features as the circuit bridge of the three-level circuit topology that is the subject of FIGS. 3a and 3b.

In particular, the circuit bridge of the circuit topology in accordance with an embodiment of the present invention has upper and lower bridge halves and upper and lower bridge segments. The upper and lower bridge segments are respectively associated with the upper and lower bridge halves. Each bridge half has an outer power switch (S1; S4) and an inner power switch (S2; S3). Outer and inner switches (S1, S2; S3, S4) of each bridge half are connected in series. Each bridge segment has a diode (D1; D2) and an inner switch (S2; S3) of the associated bridge half. Diode (D1; D2) and inner switch (S2; S3) of the associated bridge half in each bridge segment are connected in series. A bridge output BA is respectively connected to upper and lower boundary potentials (U_ZK+; U_ZK−) through outer switches (S1; S4) of the upper and lower bridge halves. Bridge output BA is further connected to a center potential (U_ZK/2) applied between the upper and lower potentials (U_ZK+; U_ZK−) through each of the upper and lower bridge segments. A phase connection PA is connected to bridge output BA. Phase connection PA is connected to bridge output BA through a filter that is formed by an inductor and a capacitor.

The circuit bridge of the circuit topology in accordance with an embodiment of the present invention differs from the circuit topology that is the subject of FIGS. 3a and 3b in that in the circuit bridge each of the upper and lower bridge halves further has a parallel power switch (S5; S6). Parallel switch (S5; S6) of each bridge half is connected in parallel to the series-connected outer and inner switches (S1, S2; S3, S4) of the bridge half. Bridge output BA is further respectively connected to the upper and lower potentials through parallel switches (S5; S6) of the upper and lower bridge halves.

Figure 1A:
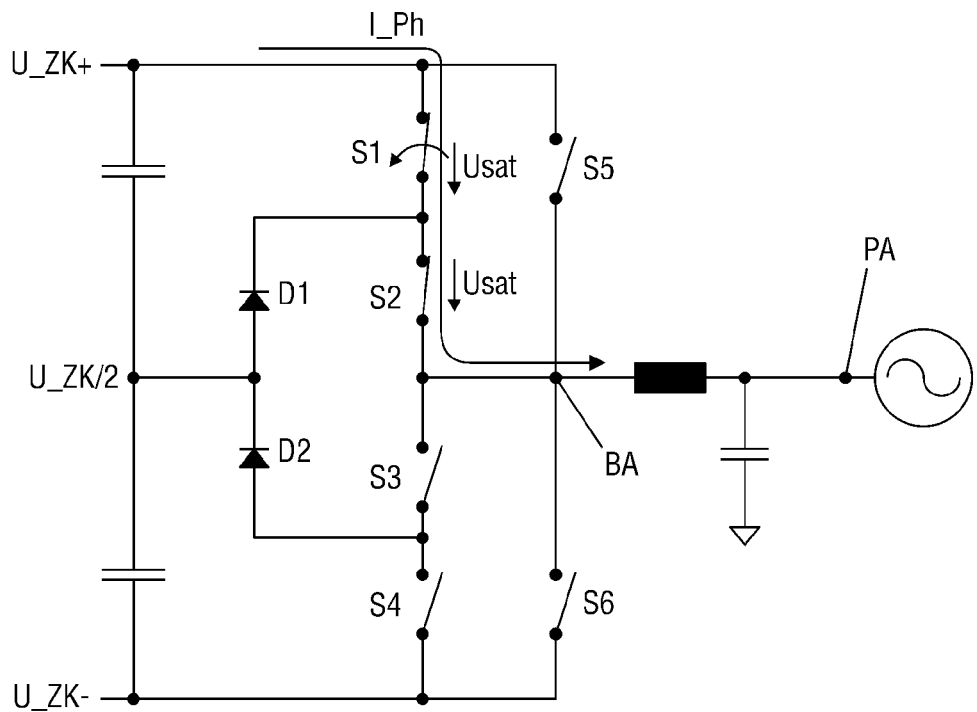
FIGS. 1a, 1b, 1c, and 1d each illustrates a circuit diagram of a three-level circuit topology according to an embodiment of the present invention with FIGS. 1a and 1b respectively depicting two different switching time intervals during the closing of the outer switch of the upper bridge half and FIGS. 1c and 1d respectively depicting two different switching time intervals during the opening of the outer switch of the upper bridge half.
Figure 1B:
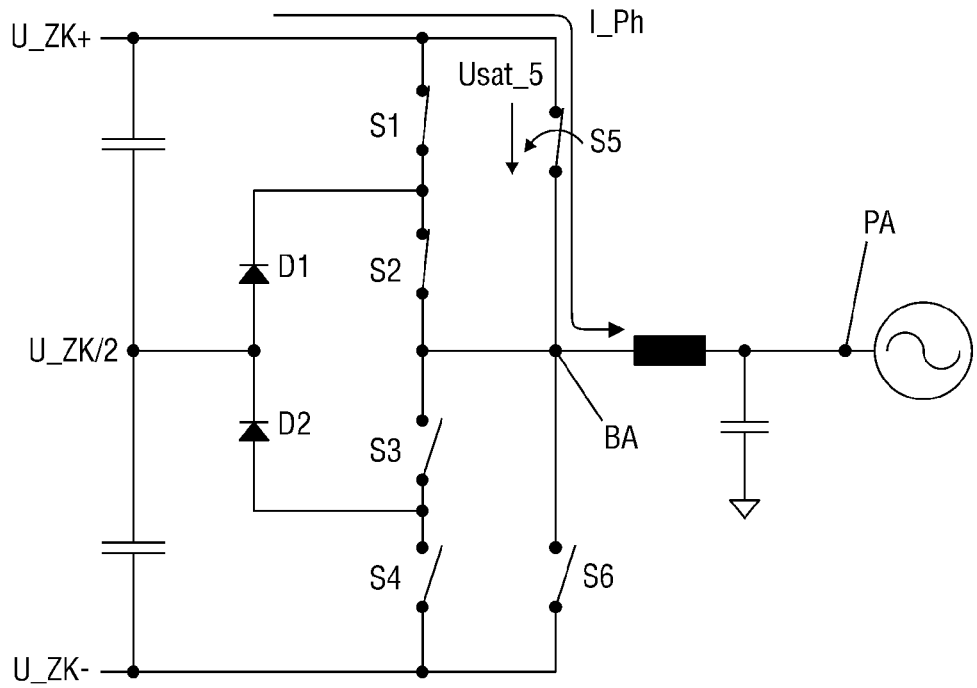
Figure 1C:
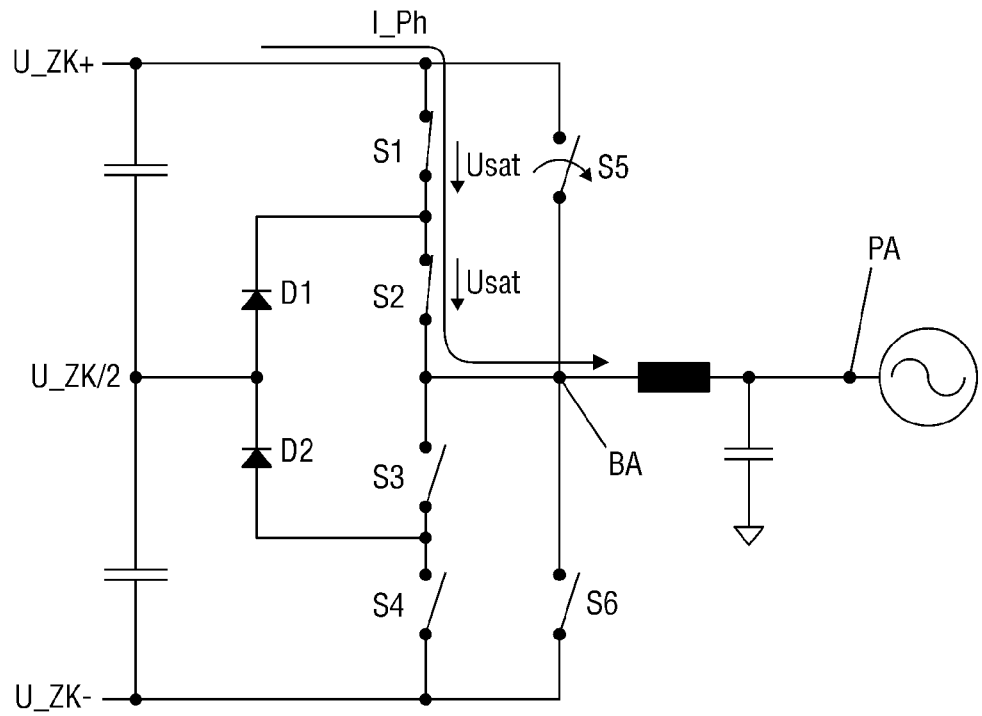
Figure 1D:
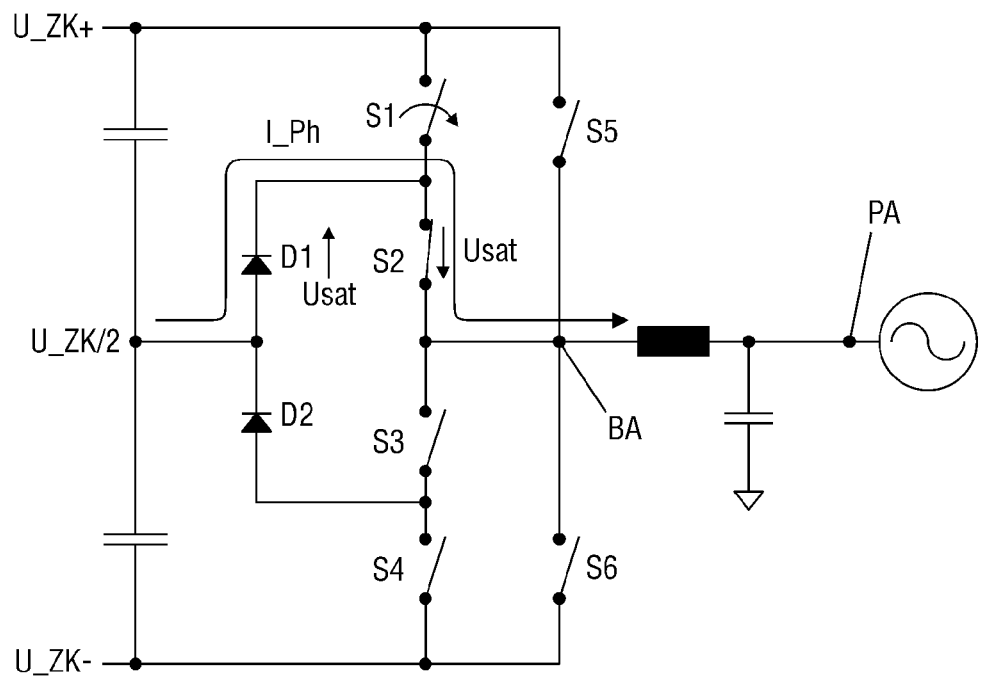
Figure 2:
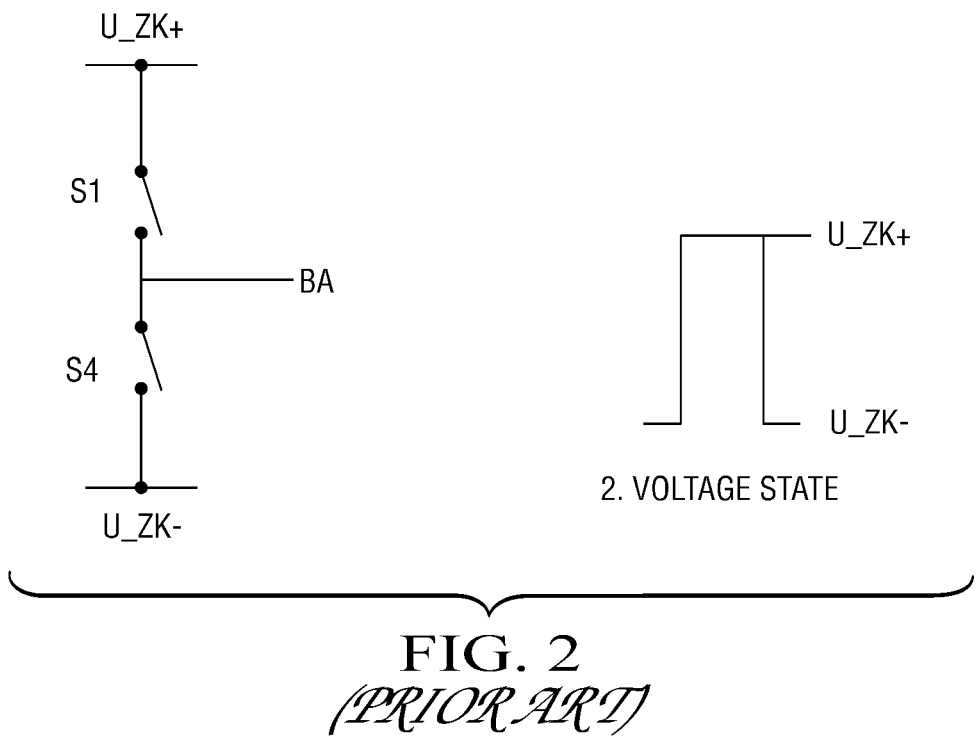
FIG. 2 illustrates a circuit diagram of a conventional two-level half bridge.

FIGS. 1a and 1b respectively depict two different switching time intervals during the closing of outer switch S1 of the upper bridge half and FIGS. 1c and 1d respectively depict two different switching time intervals during the opening of outer switch Si of the upper bridge half. As such, here too, as in the preceding example, only a single switching pulse is considered, i.e., the opening and closing of outer power switch S1 of the upper bridge half.

During this time interval the potential of the sinusoidal phases (i.e., grid voltage U_Ph) always lies above center potential U_ZK/2 and inner switch S2 is closed during the entire time interval. As shown in FIG. 1a, outer switch S1 closes at the start of the "on-time" and the output voltage on bridge output BA corresponds to U_ZK+. The switching-on loss PSchalt_ein results from closing inner switch S2. In the closed state, phase current I_Ph first flows through outer and inner switches S1 and S2. After a short delay interval compared to the entire "on-time" parallel switch S5 also closes as is shown in FIG. 1b. Only a small voltage is applied over parallel switch S5 before switching on. Namely, the sum of the saturation voltages of outer and inner switches S1 and S2. Thus, with the values that are used in the example presented here, a voltage of 3 volts. As such, no relevant switching losses arise when parallel switch S5 is turned on. Phase current I_Ph subsequently flows through parallel switch S5 whose saturation voltage Usat_5 is indicated here to be 2 volts as an example.

Shortly before the end of the "on-time" parallel switch S5 again opens, as shown in FIG. 1c. Since after opening parallel switch S5 phase current I_Ph is shown passing through the series circuit of the still closed outer and inner switches S1 and S2. Only a small voltage is applied over parallel switch S5. As such, no relevant switching losses arise during the switching off process. Shortly after parallel switch S5 opens, outer switch S1 also opens at the end of the "on-time" and phase current I_Ph then flows through diode D1 and inner switch S2 as is shown in FIG. 1d. When outer switch S1 is turned off, the switching off loss PSchalt_aus occurs. Using the effective phase current of I_Ph=100 amperes assumed in this example, to an approximation, a forward power dissipation of P_DV =100 A*2 V*1=200 watts occurs during the "on-time" based on the assumed saturation voltage of parallel switch S5 of Usat_5=2 volts.

The switching losses that arise in this circuit bridge in accordance with an embodiment of the present invention are identical to those that arise in the previously described circuit bridge of the conventional three-level circuit topology. Using the switch mentioned in the introduction, having the characteristic of reduced switching losses in loads with a higher saturation voltage, these losses can be reduced even further in the series circuit of outer and inner switches S1 and S2. The disadvantage of the higher saturation voltage of outer and inner switches S1 and S2 does not act negatively due to the current that essentially passes through parallel switch S5. Parallel switch S5 again ideally has the exact inverse characteristic. Namely, parallel switch S5 has the smallest possible saturation voltage without taking its possible switching losses into consideration, which indeed do not play a role in this circuit bridge in accordance with an embodiment of the present invention.

The forward losses based on the saturation voltage, which are dominant at low and medium pulse frequencies in multi-level topologies, can be significantly reduced using the new circuit topologies during the PWM-on-time. Since the losses through the saturation voltage are proportional to the current, the current in many typical applications has about the same phase as the voltage, and at high voltages the PWM-on-time is large compared to the PWM-off-time, this new circuit bridge reduces the overall conduction losses to a remarkable extent.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A circuit topology for a phase connection of an inverter, the circuit topology comprising:
   a circuit bridge having upper and lower bridge halves and upper and lower bridge segments respectively associated with the upper and lower bridge halves, wherein each bridge half has an outer switch and an inner switch connected in series, wherein each bridge segment has a diode and the inner switch of the associated bridge half connected in series;
   the circuit bridge having an output respectively connected to upper and lower potentials through the outer switches of the upper and lower bridge halves, the output of the circuit bridge further connected to a center potential applied between the upper and lower potentials through each of the upper and lower bridge segments;
   each of the upper and lower bridge halves further has a parallel switch, wherein the parallel switch of each bridge half is connected in parallel to the series-connected outer and inner switches of the bridge half;
   wherein the outer and inner switches of each bridge half are configured to produce relatively smaller switching losses than the parallel switch of the bridge half;
   wherein the parallel switch of each bridge half is configured to produce relatively smaller conduction losses than the outer and inner switches of the bridge half;
   the output of the circuit bridge being further respectively connected to the upper and lower potentials through the parallel switches of the upper and lower bridge halves;
   wherein the parallel switch of each bridge half is controlled to open and close while the outer and inner switches of the bridge half are closed;
   wherein the outer switch of each bridge half is controlled to open after the parallel switch of the bridge half has opened and while the inner switch of the bridge half is closed, and the outer switch of each bridge half is controlled to close prior to the parallel switch of the bridge half closing and while the inner switch of the bridge half is closed.

2. The circuit topology of claim 1 wherein:
   the outer and inner switches of the upper and lower bridge halves are MOSFETs.

3. The circuit topology of claim 2 wherein:
the parallel switches of the upper and lower bridge halves are IGBTs.

4. The circuit topology of claim 1 wherein:
the parallel switches of the upper and lower bridge halves are IGBTs.

5. A method for producing a phased output voltage of an inverter by a circuit bridge having upper and lower bridge halves and upper and lower bridge segments respectively associated with the upper and lower bridge halves, each bridge half having an outer switch and an inner switch connected in series, each bridge segment having a diode and the inner switch of the associated bridge half connected in series, an output of the circuit bridge respectively connected to upper and lower potentials through the outer switches and further connected to a center potential applied between the upper and lower potentials through each of the bridge segments, each of the bridge halves further having a parallel switch, the parallel switch of each bridge half being connected in parallel to the series-connected outer and inner switches of the bridge half, the outer and inner switches of each bridge half being configured to produce relatively smaller switching losses than the parallel switch of the bridge half, the parallel switch of each bridge half being configured to produce relatively smaller conduction losses than the outer and inner switches of the bridge half, and the output of the circuit bridge being further respectively connected to the upper and lower potentials through the parallel switches, the method comprising:

initiating a sequence of a switching pulse over a time period at whose beginning and end the inner switch of the upper bridge half is closed and all of the other switches are opened with the bridge output being connected to the center potential through the upper bridge segment via the diode of the upper bridge segment and the inner switch of the upper bridge half;

closing the outer switch of the upper bridge half while the parallel switch of the upper bridge half is opened and the inner switch of the upper bridge half is closed;

closing the parallel switch of the upper bridge half, while the outer and inner switches of the upper bridge half are closed, after a delay time that is a fraction of the time period of the switching pulse;

opening the parallel switch of the upper bridge half, while the outer and inner switches of the upper bridge half are closed, shortly before the end of the switching pulse; and opening the outer switch of the upper bridge half, while the parallel switch of the upper bridge half is opened and the inner switch of the upper bridge half is closed, after a delay time that is a fraction of the time period of the switching pulse.

6. The method of claim 5 wherein:
the outer and inner switches are MOSFETs.

7. The method of claim 6 wherein:
the parallel switches are IGBTs.

8. The method of claim 5 wherein:
the parallel switches are IGBTs.

* * * * *